United States Patent [19]

Taguchi

[11] Patent Number: 5,260,228
[45] Date of Patent: Nov. 9, 1993

[54] METHOD OF MAKING A SEMICONDUCTOR DEVICE HAVING A CHARGE TRANSFER DEVICE, MOSFETS, AND BIPOLAR TRANSISTORS

[75] Inventor: Minoru Taguchi, Oomiya, Japan

[73] Assignee: Kabushiki Kaisha Toshiba, Kawasaki, Japan

[21] Appl. No.: 977,836

[22] Filed: Nov. 17, 1992

Related U.S. Application Data

[62] Division of Ser. No. 641,920, Jan. 16, 1991, Pat. No. 5,184,203.

[30] Foreign Application Priority Data

Jan. 19, 1990 [JP] Japan .................................. 2-9576

[51] Int. Cl.⁵ .......................................... H01L 21/70
[52] U.S. Cl. .......................................... 437/53; 437/59
[58] Field of Search .......................... 437/53, 54, 59

[56] References Cited

U.S. PATENT DOCUMENTS

| | | | |
|---|---|---|---|
| 4,314,857 | 2/1982 | Aitken | 359/24 |
| 4,484,388 | 11/1984 | Iwasaki | 437/59 |
| 4,642,877 | 2/1987 | Garner et al. | 437/53 |
| 4,646,124 | 2/1987 | Zunino | 357/43 |
| 4,764,482 | 8/1988 | Hsu | 437/59 |
| 4,859,624 | 8/1989 | Goto | 437/53 |

FOREIGN PATENT DOCUMENTS 0242748 10/1987 European Pat. Off.
0245515 11/1987 European Pat. Off.
0392536 10/1990 European Pat. Off.

OTHER PUBLICATIONS

Electronics, Oct. 28, 1976, pp. 8E and 10E, "One process adapts CCD devices to MOS, bipolar peripheral circuits."

*Primary Examiner*—Tom Thomas
*Attorney, Agent, or Firm*—Finnegan, Henderson, Farabow, Garrett & Dunner

[57] ABSTRACT

A semiconductor device having a semiconductor substrate of a first conductivity type, an epitaxial layer of a second conductivity type formed on a major surface of the semiconductor substrate, an isolation layer of the first conductivity type formed in the epitaxial layer and extending from a surface thereof to the major surface of the semiconductor substrate. The isolation layer divides the epitaxial layer into first, second, and third islands. The device further has two wells of the first conductivity type, formed in the first and second islands, respectively, and extending to the substrate, a charge transfer device having a back gate formed of the first well, an insulated-gate FET of the first conductivity type, having a back gate formed of the second island, an insulated-gate FET of the second conductivity type, having a back gate formed of the second well, and a bipolar transistor having a collector formed of the third island. The first island surrounds the first well which serves as back gate of the charge transfer device, and thus blocks the noise generated in the first well. Hence, the other islands are free from the influence of the noise.

12 Claims, 9 Drawing Sheets

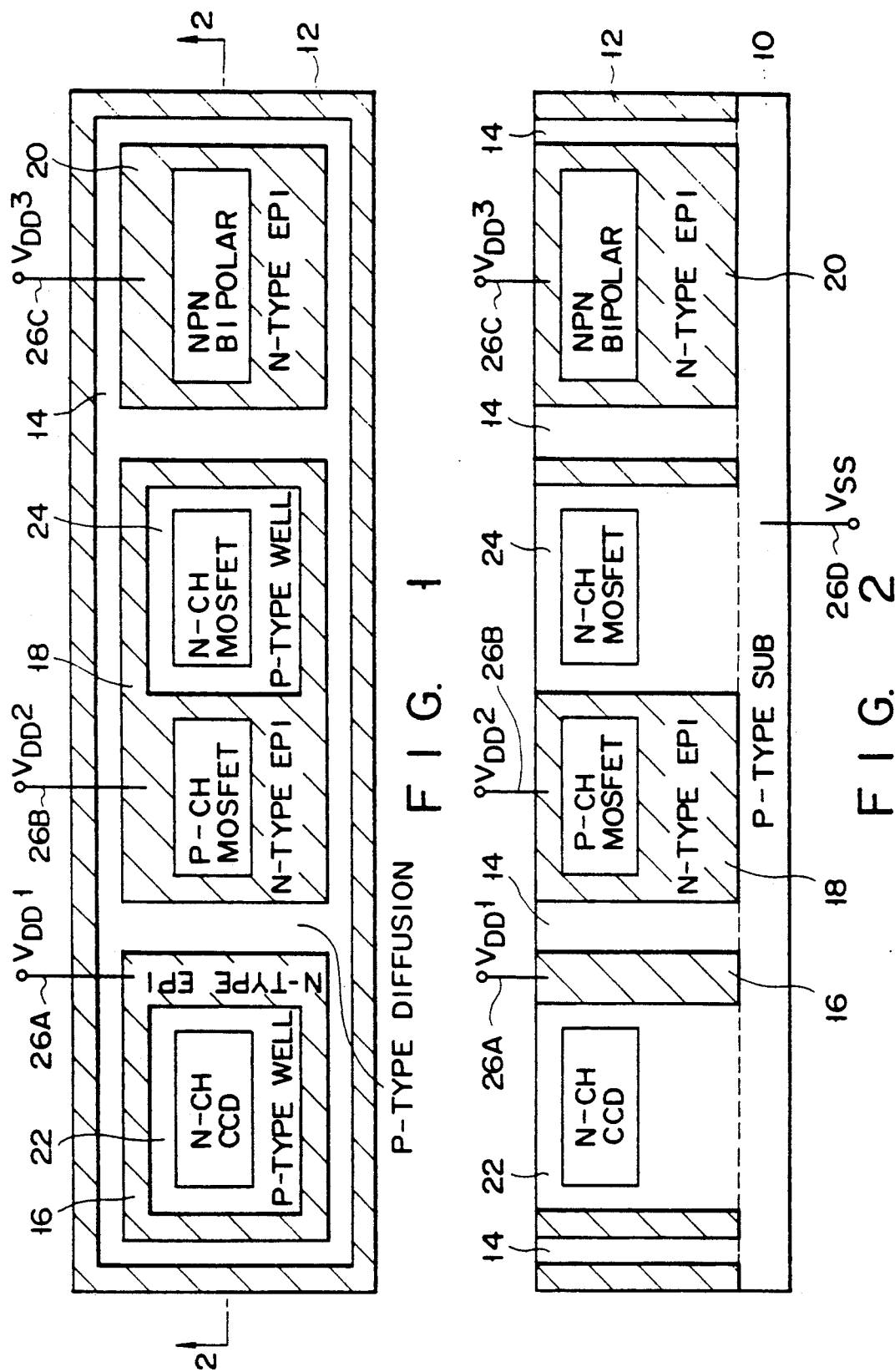

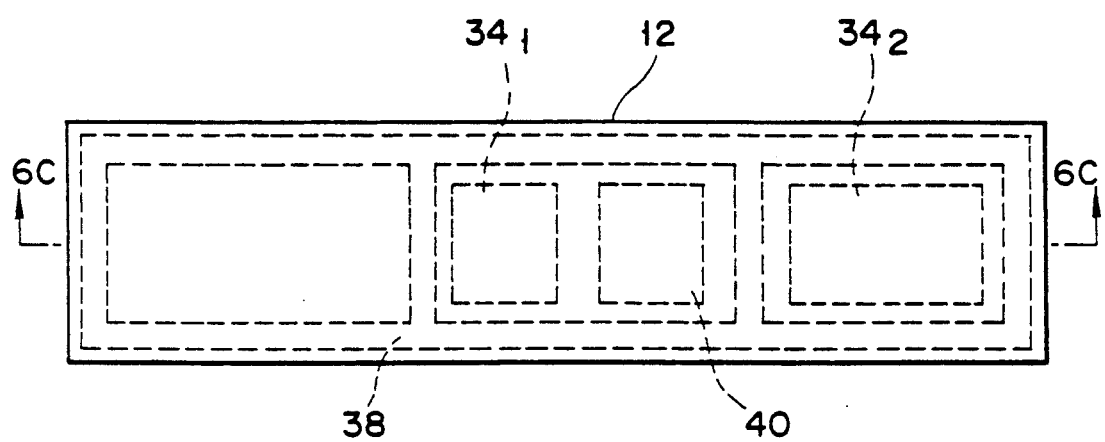
F I G. 5C
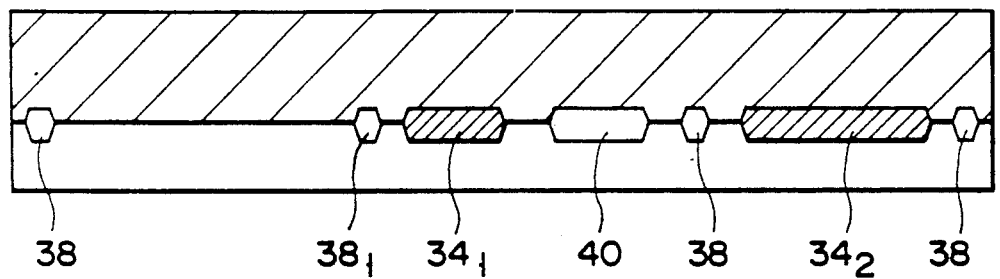
F I G. 6C

METHOD OF MAKING A SEMICONDUCTOR DEVICE HAVING A CHARGE TRANSFER DEVICE, MOSFETS, AND BIPOLAR TRANSISTORS

This is a division of application Ser. No. 07/641,920, filed Jan. 6, 1991, now U.S. Pat. No. 5,184,203.

BACKGROUND OF THE INVENTION

1. Field of the Invention

The present invention relates to a semiconductor device having a charge transfer device, MOSFETS, and bipolar transistors—all formed in a single semiconductor substrate.

2. Description of the Related Art

Various charge transfer devices are known, among which is a charge-coupled device (hereinafter referred to as a "CCD"). The CCD is formed in a semiconductor substrate, along with N-type channel MOSFETs which constitute various peripheral circuits for the CCD, such as a circuit for switching CCD delay lines, a CCD-driving circuit, a sample-and-hold circuit, an output circuit and a clock-driving circuit. Hitherto, a 12 V or 9 V power supply has been used to drive the N-type channel MOSFETS. Recently, a 5 V power supply is used instead, to save power, to cope with the increasing use of CMOS devices including MOSFETS, and to match the power-supply voltage of the MOSFETs with that of bipolar transistors formed on a separate chip.

When driven by a voltage of 5 V, the sample-and-hold circuit and the output circuit, either formed of N-type channel MOSFETs and being an operational amplifier, fail to produce outputs having a sufficient linearity. The poorer the output linearity of these operational amplifiers, the lower the yield of the semiconductor device having the CCD and these peripheral circuits, as is usually proved by die sort test.

The CCD delay lines are designed to delay signals by a predetermined period of time. Most circuits for processing the signals thus delayed are bipolar transistor ICs which are formed on separate chips.

Assume that the CCD and bipolar transistors are formed in the same semiconductor substrate, thus replacing the operational amplifiers having MOSFETS, such as the sample-and-hold circuit and the output circuit, with operational amplifiers comprising bipolar transistors which operate at higher speeds than MOSFETS. In this case, the operational amplifiers have better output linearity, and the semiconductor device having the CCD and operational amplifiers can be manufactured with higher yield and can operate with higher efficiency. In addition, the use of the bipolar transistor IC, which processes the signals output by the CCD, results in space savings, reduction in manufacturing cost, increased function, and a simplified system.

To make the CCD transfer an electrical charge, a transfer clock signal is supplied to the CCD. Some part of this clock signal leaks and makes noise while being supplied through the semiconductor substrate. The noise adversely influences the bipolar transistors. In view of this, it is not advisable to form bipolar transistors, together with a CCD, in the same semiconductor substrate. If influenced by the noise, bipolar transistors fail to exhibit good characteristics, and the semiconductor device comprising the CCD and the bipolar transistors will have insufficient reliability.

SUMMARY OF THE INVENTION

Accordingly it is the object of this invention to provide semiconductor device which comprises a charge transfer device, bipolar transistors, and and MOSFETS,—all formed in a single semiconductor substrate,—and which operates with sufficient reliability.

To achieve the object, according to the invention, there is provided a semiconductor device comprising:

a semiconductor substrate of a first conductivity type, having a major surface;

an epitaxial layer of a second conductivity type, formed on the major surface of the semiconductor substrate;

an isolation layer of the first conductivity type formed in the epitaxial layer, extending from a surface thereof to the the substrate and dividing the epitaxial layer into first, second, and third islands;

a first well of the first conductivity type, formed in the first island and extending to the epitaxial layer;

a second well of the first conductivity type, formed in the second island and extending to the epitaxial layer;

a charge transfer device having a back gate formed of the first well;

an insulated-gate FET of the first conductivity type, having a back gate formed of the second island;

an insulated-gate FET of the second conductivity type, having a back gate formed of the second well; and a bipolar transistor having a collector formed of the third island.

The first island surrounds the first well which serves as a back gate of the charge transfer device. Hence, the first island blocks the noise generated in the first well, and the noise does not influence other islands. The device is therefore reliable despite the charge transfer device and the bipolar transistor being formed on the same chip.

Further, since the collector of the bipolar transistor is formed of the second island which, in turn, is made of the epitaxial layer, the breakdown voltage of the bipolar transistor can be varied, merely by changing the thickness of the epitaxial layer. In addition, since the first and second islands are electrically isolated, the collector bias of the bipolar transistor can be made to differ from the back-gate bias of the insulated-gate FET which back gate is formed of the first island. Therefore, the freedom of designing the device is great.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plane view showing the general structure of a semiconductor device according to a first embodiment of the present invention, in particular, an element-forming region of the device;

FIG. 2 is a sectional view, taken along line 2—2 in FIG. 1;

FIGS. 5A to 5D are plane views, explaining the steps of manufacturing the second embodiment semiconductor device; and FIGS. 6A to 6E are sectional views, explaining the steps of manufacturing the second embodiment device, FIGS. 6A to 6D being taken along lines 6A—6A to 6D—6D shown in FIGS. 5A to 5D, respectively.

DETAILED DESCRIPTION OF THE PREFERRED EMBODIMENTS

Figure 3A:
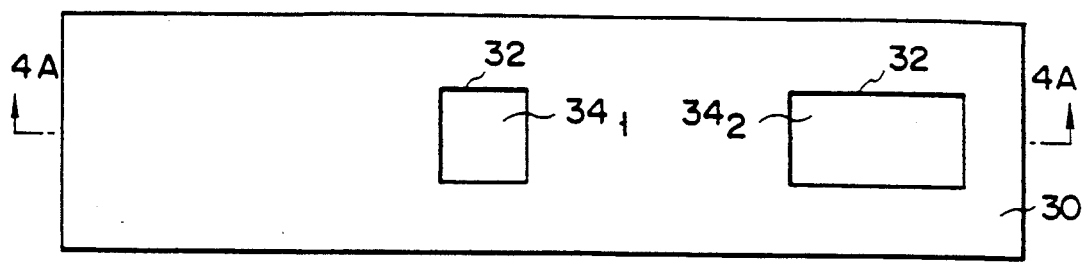
FIGS. 3A to 3D are plane views representing the electrode patterns and explaining the steps of manufacturing the device shown in FIG. 1.

Several embodiments of the present invention will now be described, with reference to the accompanying drawings.

FIG. 1 is a plane view showing the general structure of a semiconductor device according to a first embodiment of the present invention. In particular, FIG. 1 shows the element-forming region of the semiconductor device. FIG. 2 is a sectional view, taken along line 2—2 in FIG. 1.

As FIGS. 1 and 2 show, an N-type silicon epitaxial layer 12 is formed on a P-type silicon substrate 10. A P-type isolation diffusion layer 14 is formed in the layer 12 by diffusing a P-type impurity into the layer 12. As is evident from FIG. 2, the layer 14 extends from the upper surface of the silicon epitaxial layer 12 to the upper surface of the silicon substrate 10, dividing the layer 12 into three N-type islands 16, 18, and 20. P-type semiconductor regions 22 and 24 are formed in the islands 16 and 18, respectively. Both regions 22 and 24 reach the P-type substrate 10. An N-channel CCD is formed on the semiconductor region 22, which serves as back gate of the N-channel CCD. A P-channel MOSFET is formed on the island 18, which serves as back gate of the P-channel MOSFET. An N-channel MOSFET is formed on the semiconductor region 24, which serves as back gate of the N-channel MOSFET. An NPN bipolar transistor is formed on the island 20, which serves as collector of the NPN bipolar transistor.

As is shown in FIG. 1, the N-type island 16 surrounds the semiconductor region 22 on which the N-channel CCD is formed. Hence, the N-type island 16, blocks the noise generated from the transfer clock signal supplied to the CCD, and the bipolar transistor is free from the influence of that noise. The bipolar transistor operates reliably despite that the bipolar transistor, the CCD and the MOSFETs being formed in the same substrate 10.

The islands 16, 18, and 20 are electrically floating from the substrate 10. Various potentials are applied to these islands 16, 18, and 20. More precisely, potentials VDD1, VDD2 and VDD3 are respectively applied to the islands 16, 18, and 10 through terminals 26A, 26B, and 26C. Potential VSS is applied to the substrate 10 via a terminal 26D. The potentials VDD1 to VDD3 can be varied, thereby changing the back-gate bias of the P-channel MOSFET and the collector bias of the NPN bipolar transistor. In addition, since the island 20 serves as the collector of the NPN bipolar transistor, the breakdown voltage thereof can be varied to any desired value, merely by changing the thickness of the N-type epitaxial layer 12. Therefore, the characteristics of the active elements can be easily changed in accordance with the design characteristics of the semiconductor device comprising the CCD, the MOSFETs and the bipolar transistor which are all formed in the same substrate 10.

The potential VDD1 can absorb the noise the CCD generates. The potential VDD2 is optimal as the back-gate bias of the P-channel MOSFET. The potential VDD3 is optimal as the collector bias of the NPN bipolar transistor.

With reference to FIGS. 3A to 3D and FIGS. 4A to 4I, it will be explained how the semiconductor device shown in FIGS. 1 and 2 is manufactured, thus describing the device in greater detail.

FIGS. 3A to 3D are plane views representing the electrode patterns and explaining the steps of manufacturing the device shown in FIG. 1. FIGS. 4A to 4I are sectional views, explaining the steps of manufacturing the device shown in FIG. 1. FIGS. 4A to 4D are sectional views taken along lines 4A—4A to 4D—4D which are shown in FIGS. 3A to 3D, respectively. In these figures, the components identical to those shown in FIGS. 1 and 2 are denoted by the same reference numerals.

Figure 4A:
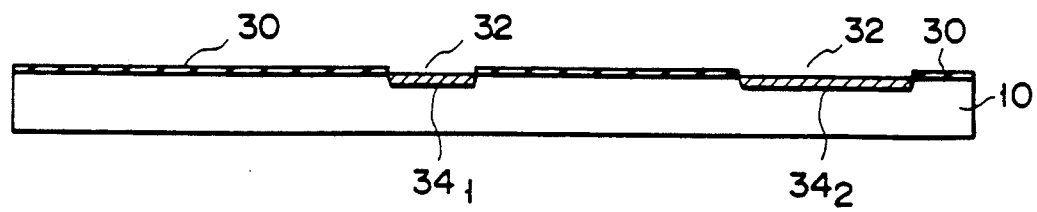
FIGS. 4A to 4I are sectional views, explaining the steps of manufacturing the device shown in FIG. 1, FIGS. 4A to 4D being taken along lines 4A—4A to 4D—4D which are shown in FIGS. 3A to 3D, respectively.

As is illustrated in FIGS. 3A and 4A, the surface region of the P-type silicon substrate 10, which has a resistivity of 25 Ω·cm, is heated at about 1000° C. and thermally oxidized, thus forming a silicon oxide film 30 having a thickness of about 1 μm. The silicon oxide film 30 is patterned by means of photoetching, thus forming windows 32 in the film 30. Antimony is diffused through these windows 32 into the P-type substrate 10, thereby forming N+-buried layers $34_1$ to $34_2$ in the substrate 10, the layers $34_1$ to $34_2$ having a sheet resistance of 20 Ω/□. Then, the silicon oxide film 30 is removed from the substrate 10.

Figure 3B:
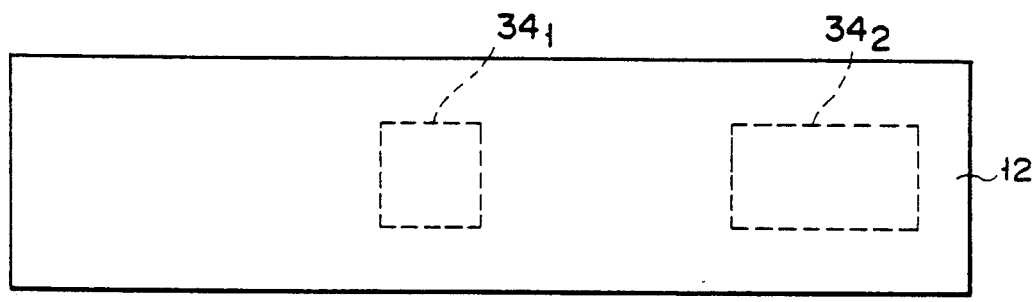
Figure 4B:
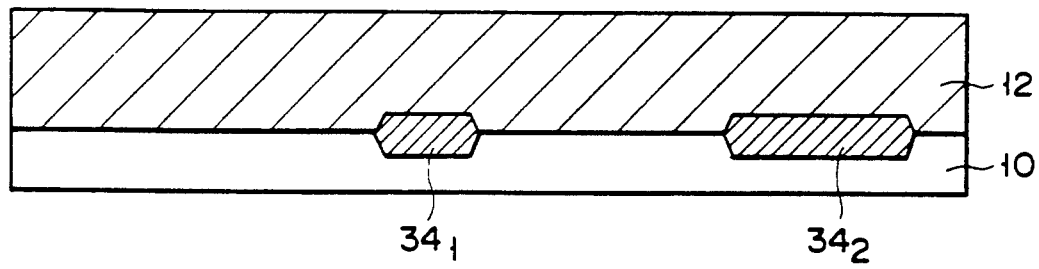

Then, as is shown in FIGS. 3B and 4B, an N-type silicon epitaxial layer 12 containing phosphorus and having a resistivity of about 5 Ω·cm is grown to the thickness of about 5 μm, on the upper surface of the resultant structure. While the layer 12 is growing, the impurities diffuse into the layer 12 from the portions forming N+-buried layers $34_1$ and $34_2$ and between the substrate 10 and the epitaxial layer 12. Theses layers $34_1$ and $34_2$ and have impurity concentrations higher than that of the epitaxial layer 12.

Figure 3C:
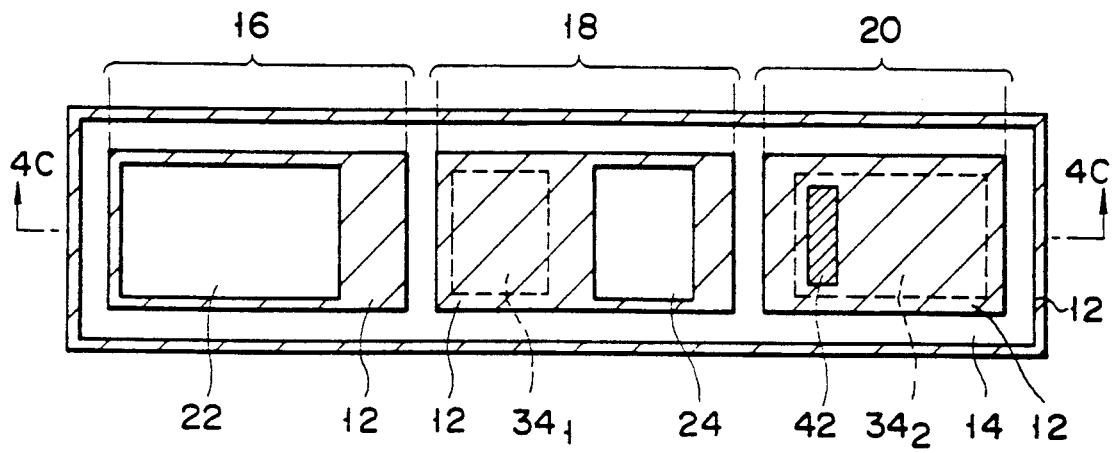
Figure 4C:
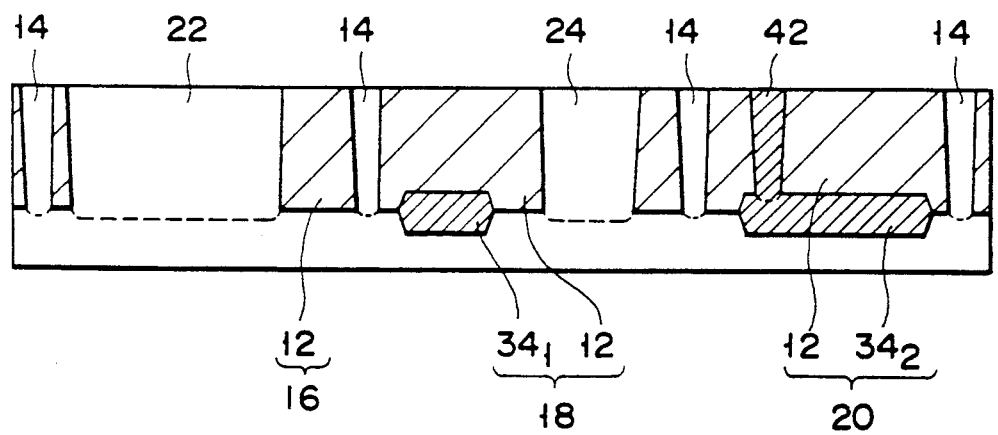

Further, the surface of the epitaxial layer 12 is subjected to thermal oxidation at 1000° C., thereby forming a silicon oxide film (not shown) having a thickness of about 500 Å and serving as a photoresist pad. Then a photoresist (not shown) is formed on the silicon oxide film, a portion of the photoresist is removed by photoetching, thus forming an opening. Phosphorus ions, for example, are injected through the opening into the epitaxial layer 12, thereby forming a collector region. The remaining photoresist is removed from the silicon oxide film. Next, a photoresist is formed on the silicon oxide film. The photoresist is photo-etched, thereby openings made in the photoresist. Boron ions, for example, are injected through these openings into the epitaxial layer 12, thereby forming P-type wells and P-type isolation diffusion layers in the layer 12. The photoresist is removed from the silicon oxide film. Further, an undoped CVD oxide film (not shown) having a thickness of about 3000 Å is formed on the upper surface of the resultant structure by means of a CVD method. The structure is subjected to cap annealing at about 1190° C., thereby forming, as is shown in FIGS. 3C and 4C, an N+-collector region 42 reaching the N+-buried layer $34_2$, two P-type wells 22 and 24, both reaching the P-type substrate 10, and also P+-type isolation layers 14 reaching the substrate 10.

The P+-type isolation layers 14 isolate three islands 16, 18, and 20. The island 16 is formed of a part of the N-type epitaxial layer 12. The island 18 consists of a part of the N-type epitaxial layer 12 and N+-buried layer $34_1$ which are electrically combined. The island 20 consists of a part of the N-type epitaxial layer 12 and N+-buried layer $34_2$ which are electrically combined.

Figure 3D:
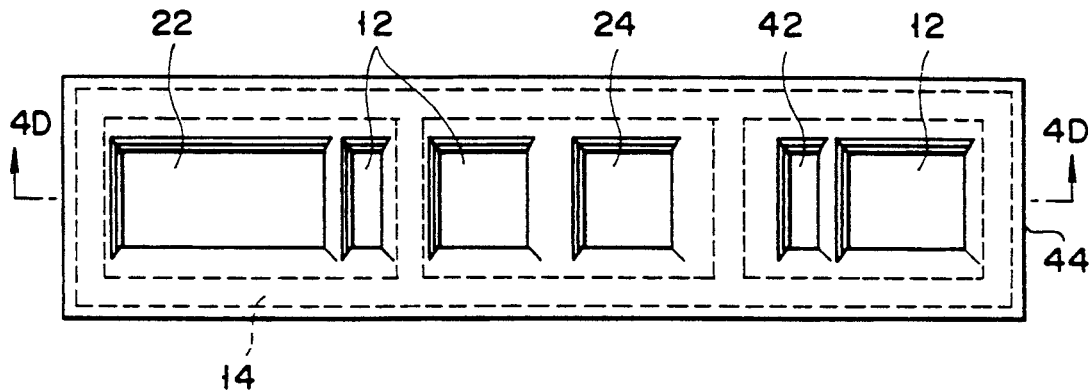
Figure 4D:
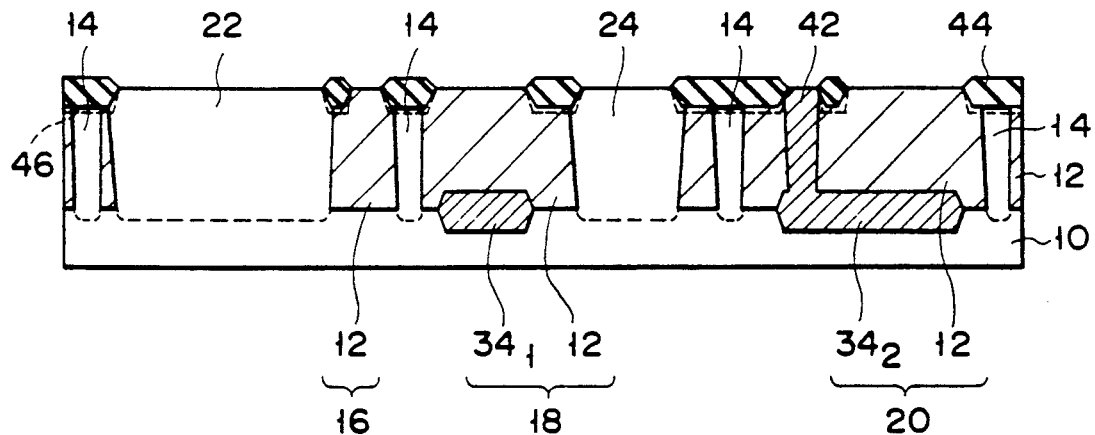

Further, as is illustrated in FIGS. 3D and 4D, a field oxide film 44 having a thickness of about 9000 Å is formed by the known LOCOS method on the upper surface of the resultant structure. Before forming the field oxide film 44, boron or phosphorus can be ion-injected into those surface portions of the structure on which the film 44 is to be formed, thereby to form channel stoppers 46 beneath the field oxide film 44.

Figure 4E:
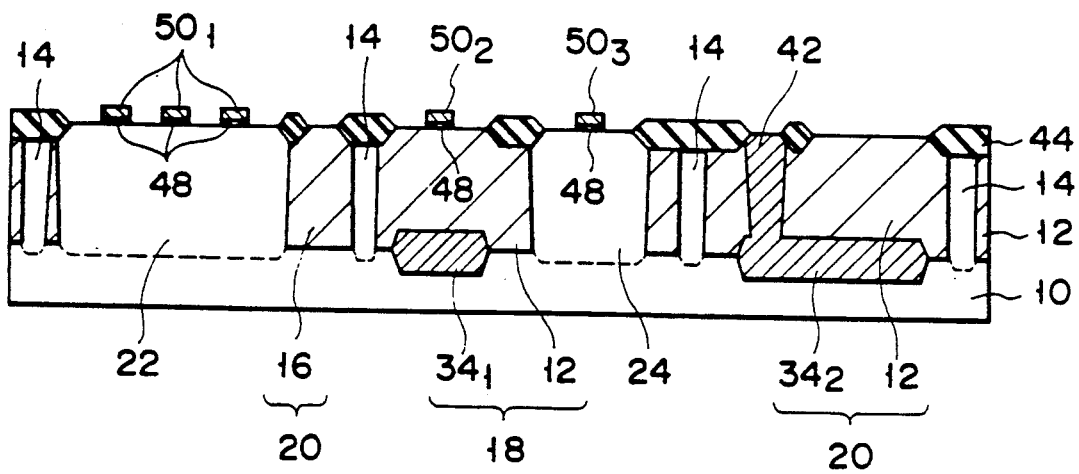

Next, as is shown in FIG. 4E, the exposed surface portion of he silicon epitaxial layer 12 are thermally oxidized at 950° C., forming a silicon oxide film 48 having a thickness of about 700 Å. This oxide film 48 will be used as the gate insulating film of the MOSFETs and as the first gate insulating film of the CCD. Boron or phosphorus is ion-injected through the film 48 into the upper surface of the structure, thus performing channel-doping. Further, a first polysilicon layer having a thickness of about 4000 Å is formed by the CVD method on the upper surface of the structure. Phosphorus is diffused into the first polysilicon layer at 950° C., using phosphoryl chloride (POCl$_3$) as impurity source. The first polysilicon layer is thereby rendered conductive, or made into an N+-type layer. Then, a photoresist is coated on the first polysilicon layer, and the photoresist is photo-etched, thus forming a mask. Using this mask, reactive ion etching (RIE) is performed on the first polysilicon layer. As a result, the first polysilicon layer is patterned, forming the first transfer gate $50_1$ of the CCD, the gate $50_2$ of the P-channel MOSFET, and the gate $50_3$ of the N-channel MOSFET. Then, the silicon oxide film 48 is removed, by applying ammonium fluoride (NH$_4$F), using the gates $50_1$, $50_2$, and $50_3$ as mask.

Figure 4F:
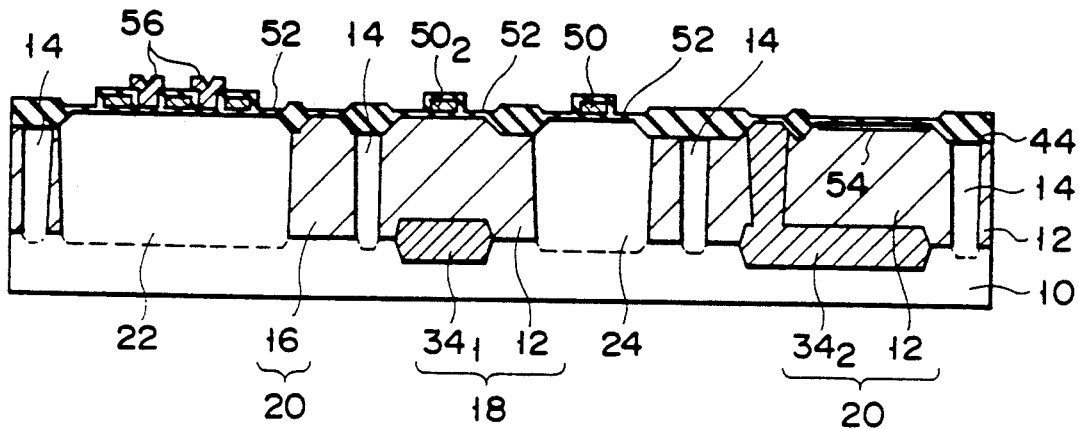

Next, as is shown in FIGS. 4F, the exposed surface portions of the silicon layer are thermally oxidized at 950° C., forming a silicon oxide film 52 having a thickness of about 700 Å. Boron ions, for example, are injected the resultant structure, by using the first transfer gate $50_1$ and a photoresist (not shown) as mask, thereby forming a barrier layer (not shown) of the CCD. Further, boron ions are injected into selected portions of the silicon epitaxial layer 12 by means of photoetching, in order to form the base of the NPN bipolar transistor. The structure is annealed at 900° C., forming a P−-inner-base layer 54. Then, a second polysilicon layer having a thickness of about 4000 Å is formed on the upper surface of the resultant structure by, for example, the CVD method. Phosphorus is diffused into the second polysilicon layer at 950° C., using phosphoryl chloride (POCl$_3$) as the impurity source, whereby the second polysilicon layer is made conductive, or becomes an N+-type layer. Then, a photoresist is coated on the second polysilicon layer, and the photoresist is photo-etched, thus forming a mask. Using this mask, reactive ion etching (RIE) is performed on the second polysilicon layer. As a result, the second polysilicon layer is patterned, forming the second transfer gates 56 of the CCD.

Figure 4G:
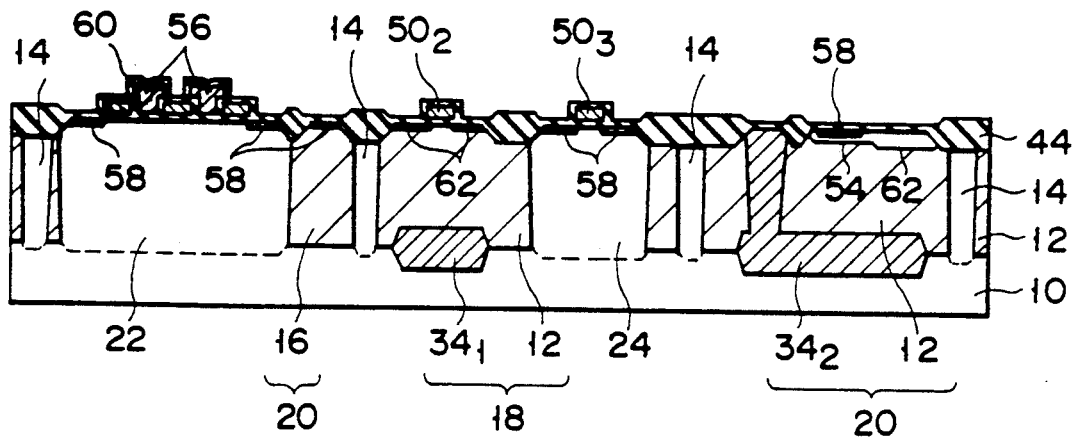

Thereafter, as is shown in FIG. 4G, arsenic ions, for example, are injected into selected portions 58 of the silicon epitaxial layer 12 by means of photoetching, in order to form the N+-emitter of the NPN bipolar transistor, the N+-source/drain of the N-channel MOSFET, and the N+-source/drain of the CCD. Next, the exposed surface portions of the silicon layer are thermally oxidized at 900° C., forming a silicon oxide film 60 on the second transfer gates 56. Boron ions, for example, are injected to selected portions 62 of the silicon epitaxial layer 12 by means of photoetching, in order to form the P+-outer base of the NPN bipolar transistor $62_2$ the P+-source/drain of the N-channel MOSFET 62, and the N+-source/drain of the CCD.

Figure 4H:
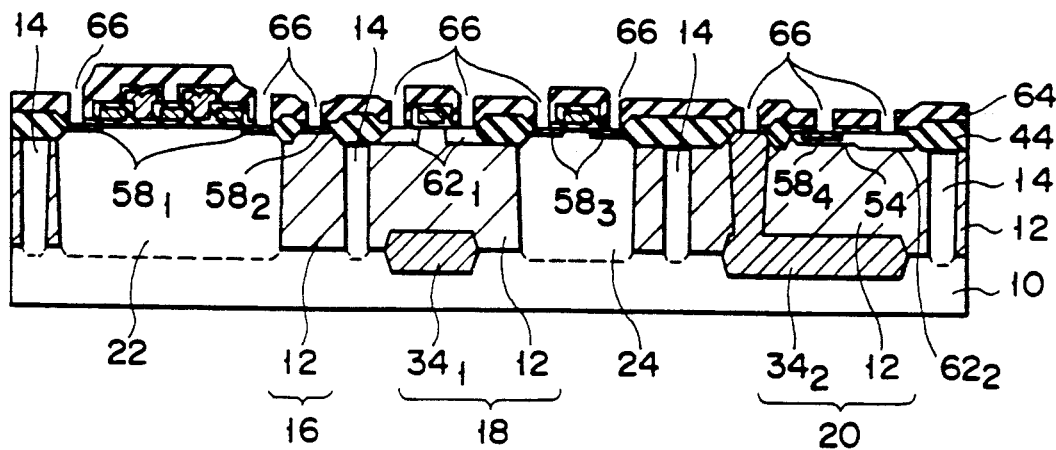

Then, as is shown in FIG. 4H, an interlayer insulator film 64 consisting of a silicon oxide film and a BPS (Boro-Phospho Silicate) glass film is formed on the resultant structure by means of the CVD method. More specifically, the silicon oxide film is formed on the upper surface of the structure, and then the BPS glass film is formed on the silicon oxide film. The silicate glass of the insulator film 64 is melted at about 950° C., thus performing not only glass-flowing but also phosphorous gettering. Simultaneously, the arsenic and boron, both ion-injected, are activated. As a result, there are formed the N+-source/drain layer $58_1$ of the CCD, the N+-contact layer $58_2$ of the island 16, the N+-source/drain layer $58_3$ of the N-channel MOSFET, and the N−-emitter layer $58_4$ of the NPN bipolar transistor. Also, the P+-source/drain $62_1$ of the P-channel MOSFET, and the P+-outer-base layer $62_2$ of the NPN bipolar transistor are formed. Further, photoetching is applied, thereby forming contact holes 66 in the interlayer insulator film 64, exposing the N+ layers $58_1$ to $58_4$ and the P+ layers $62_1$ and $62_2$.

Figure 4I:
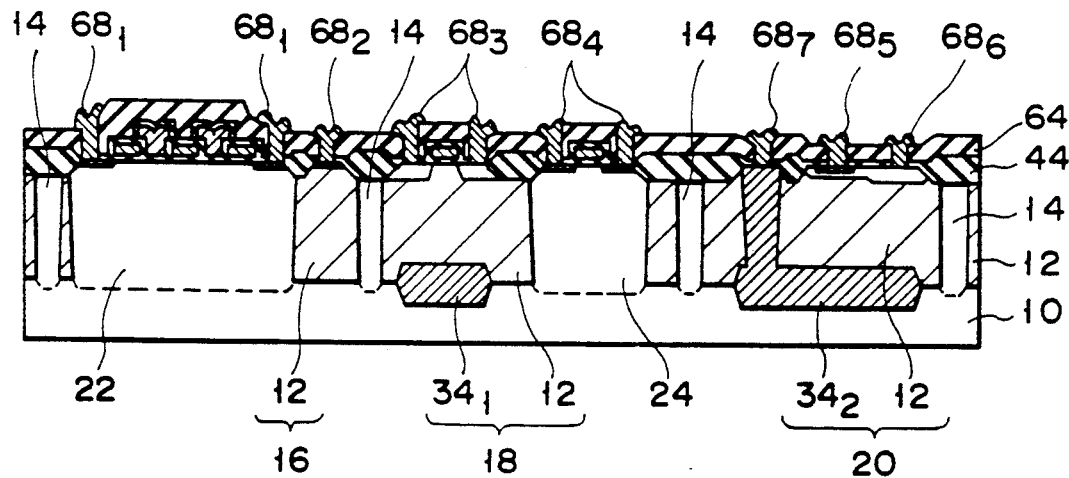

Next, as is illustrated in FIG. 4I, a metal layer made of aluminum-silicon (1%) alloy and having a thickness of about 8000 Å is formed on the upper surface of the resultant structure by means of, for example, sputtering. Then, a photoresist is coated on the metal layer, and the photoresist is photo-etched, thus forming a mask. Using this mask, reactive ion etching (RIE) is performed on the metal layer. As a result, metal wirings $68_1$ to $68_7$ are formed. The two wirings $68_1$ the source and drain wirings of the CCD, the wiring $68_2$ is the bias wiring of the island 16, the two wirings $68_3$ are the source and drain wirings of the P-channel MOSFET, the two wirings $68_4$ are the source and drain wirings of the N-channel MOSFET. The three wirings $68_5$, $68_6$, and $68_7$ are the emitter, base, and collector wirings of the NPN bipolar transistor. A forming process is performed at about 430° C., thus imparting desired characteristic to each active element.

The semiconductor device according to the first embodiment of the present invention, which is illustrated in FIG. 4I, is thereby manufactured. This device has the advantages explained with reference to FIGS. 1 and 2.

With reference to FIGS. 5A to 5D and FIGS. 6A to 6E, a semiconductor device according to a second embodiment of the present invention will be explained. FIGS. 5A to 5D are plane views representing the electrode patterns and explaining the steps of manufacturing the semiconductor device. FIGS. 6A to 6E are sectional views explaining the steps of manufacturing the devices of the second embodiment of the present invention. FIGS. 6A to 6D are sectional views taken along lines 6A—6A to 6D-6D which are shown in FIGS. 5A to 5D, respectively. The components shown in these figures, which are identical to those shown in FIGS. 3A to 3D and FIGS. 4A to 4I are denoted by the same reference numerals, and will not be described in detail.

Figure 5A:
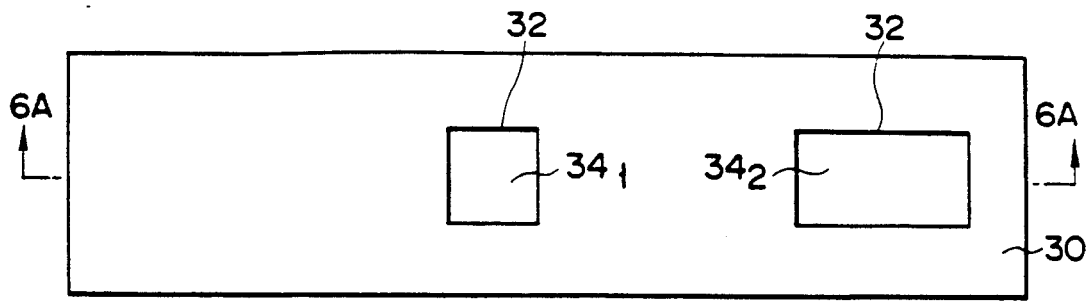
Figure 6A:
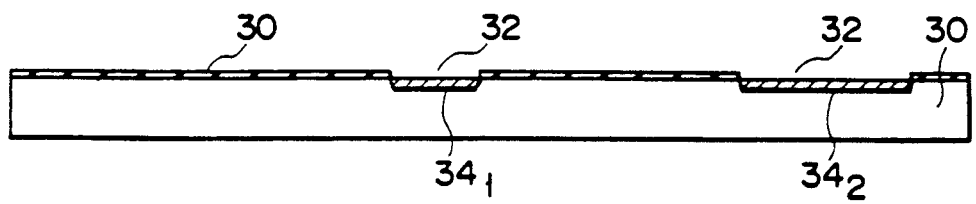

First, as shown in FIGS. 5A and 6A, N+-buried layers $34_1$ and $34_2$, each having a sheet resistance of 20 $\Omega/\square$, are formed in a P-type silicon substrate 30 which has a sheet resistance of 25 $\Omega/\square$.

Figure 5B:
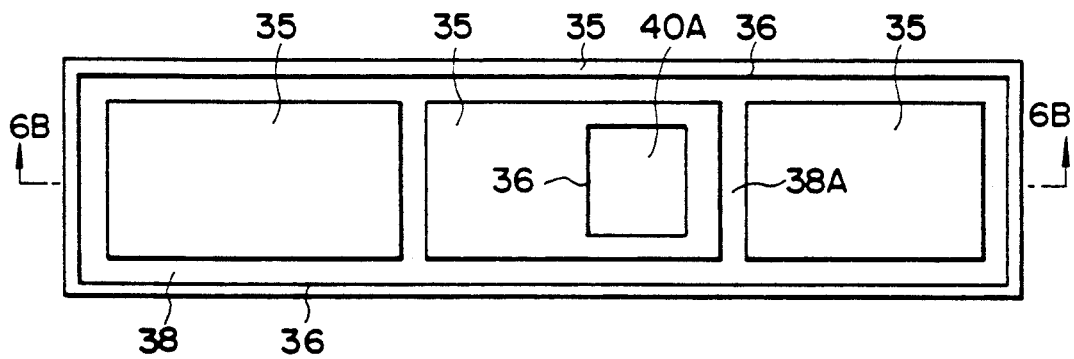
Figure 6B:
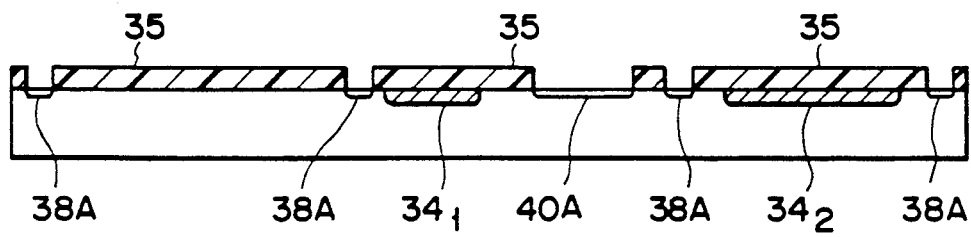

Then, as shown in FIGS. 5B and 6B, a photoresist 35 is coated on the resultant structure. A selected portion of the photoresist 35 is removed by means of photoetching, thereby forming a window 36 in the photoresist 35. Boron ions are injected into the selected portions 38 and 40 of the substrate 30 through the windows 36. Thereafter, the remaining photoresist 35 is removed from the structure.

Next, as shown in FIGS. 5C and 6C, an N-type silicon epitaxial layer 12 containing phosphorus and having a resistivity of about 20 $\Omega\cdot$cm is grown to a thickness of about 5 $\mu$m, on the upper surface of the resultant structure. While the layer 12 is growing, boron diffuses from the portions 38, $38_1$, and 40 of the substrate 30. As a result of this, N+-buried layers $34_1$ and $34_2$ and P+-buried layers 38 $38_1$, and 40 are formed between the substrate 30 and the epitaxial layer 12. The N+-buried layers $34_1$ and $34_2$ have impurity concentrations higher than the epitaxial layer 12, and the P+-buried layers 38 and 40 have impurity concentrations higher than that of the substrate 30.

Figure 5D:
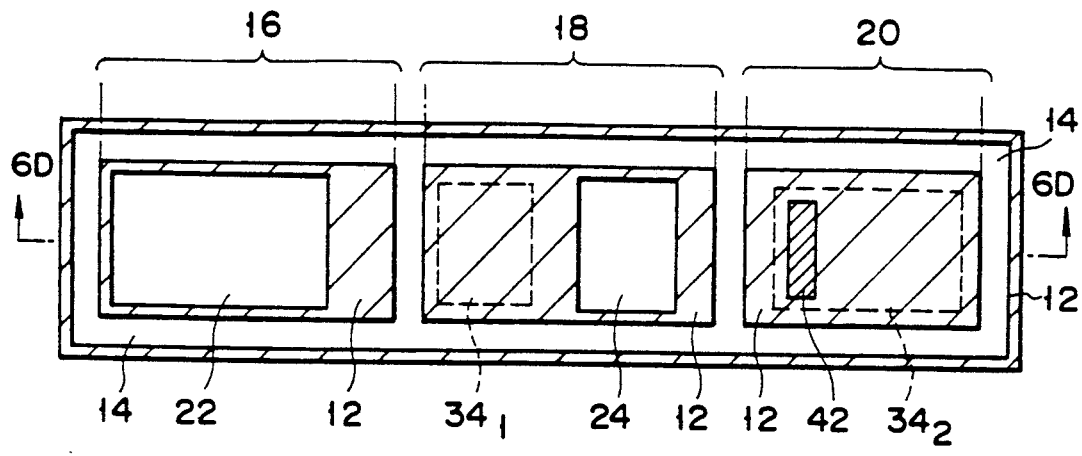
Figure 6D:
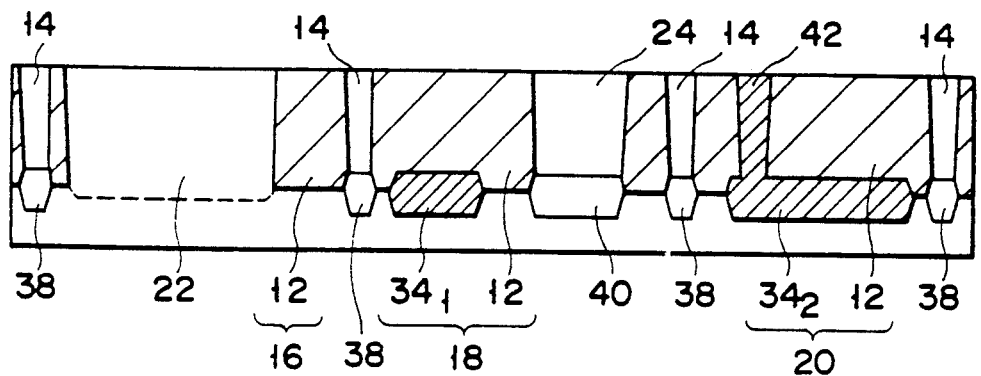

Thereafter, as be shown in FIGS. 5D and 6D, an N+-type collector region 42, P-type wells 22 and 24, and a P+-type isolation layer 14 are formed by the same method explained with reference to FIGS. 3D and 4D. The N+-type collector region 42 extends from the upper surface of the epitaxial layer 12 to the N+-buried layer $34_2$. The P-type well 22 extends from the upper surface of the layer 12 to the P-type substrate 30. The P-type well 24 extends from the upper surface of the layer 12 to the P+-buried layer 40. The P+-type isolation layer 14 extends from the upper surface of the layer 12 to the P+-buried layer 38. The P+-type isolation layer 14 is divided into three islands 16, 18, and 20, in the same way as shown in FIGS. 3C and 4C.

Next, as to illustrated in FIG. 6E, a CCD in which the back gate is the first well 22, a P-channel MOSFET in which the back gate is the second island 18, an N-channel MOSFET in which the back gate is the second well 24, and an NPN bipolar transistor in which the collector is the third island 20, are formed by the same method explained with reference to FIGS. 4F to 4I.

Figure 6E:
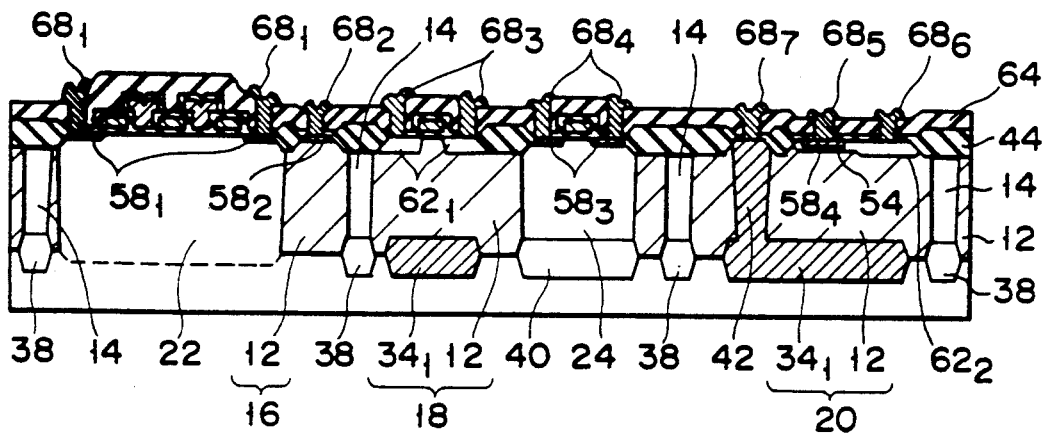

The semiconductor device according to the second embodiment of the present invention, which is illustrated in FIG. 6E is thereby manufactured. The device has the same advantages as have been described with reference to FIGS. 1 and 2. In addition, this device is advantageous in that it is hardly latched up and operates with high reliability since the P+-buried layers 38 and 40, which are formed between the P-type substrate 30 and the P-type isolation diffusion layer 14 and has an impurity concentration higher than that of the diffusion layer 14.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing semiconductor device comprising the steps of:

preparing a semiconductor substrate of a first conductivity type having a major surface;

forming an epitaxial layer of a second conductivity type on the major surface of the semiconductor substrate, the epitaxial layer having a top surface;

forming an isolation layer of the first conductivity type in the epitaxial layer, the isolation layer extending from the top surface of the epitaxial layer to the major surface of the semiconductor substrate and dividing the epitaxial layer into first, second and third islands;

forming a first semiconductor region of the first conductivity type in the first island, the first semiconductor region extending to the major surface of the semiconductor substrate;

forming a second semiconductor region of the first conductivity type in the second island, the second semiconductor region extending to the major surface of the semiconductor substrate;

forming a charge transfer device in the first semiconductor region, the charge transfer device having a back gate formed of the first semiconductor region;

forming a first insulated gate FET of the first conductivity type in the second island, the first insulated gate FET having a back gate formed of the second island;

forming a second insulated gate FET of the second conductivity type in the second semiconductor region, the second insulated gate FET having a back gate formed of the second semiconductor region, and forming a bipolar transistor in the third island, the bipolar transistor having a collector formed of the third island.

2. The method of manufacturing a semiconductor device according to claim 1, wherein the isolation layer, the first semiconductor region and the second semiconductor region are formed simultaneously.

3. The method of manufacturing a semiconductor device according to claim 2, wherein the isolation layer, the first semiconductor region and the second semiconductor region are formed by injecting impurity ions of the first conductivity type into the epitaxial layer and by thermal diffusion.

4. The method of manufacturing a semiconductor device according to claim 1 further comprising the steps of:

forming a first buried layer of the second conductivity type in the major surface of the semiconductor substrate;

forming a second buried layer of the second conductivity type in the major surface of the semiconductor substrate after the step of preparing the semiconductor substrate and before the step of forming the epitaxial layer.

5. The method of manufacturing a semiconductor device according to claim 4, wherein the second island is formed to include the first buried layer and the third island is formed to include the second buried layer.

6. The method of manufacturing a semiconductor device according to claim 5, wherein the first buried layer and the second buried layer are formed simultaneously.

7. The method of manufacturing a semiconductor device according to claim 6, wherein the first buried layer and the second buried layer are respectively formed by diffusing impurities of the second conductivity type on the major surface of said semiconductor substrate.

8. The method of manufacturing a semiconductor device according to claim 4 further comprising the steps of:

forming a third semiconductor region of the second conductivity type with an impurity concentration higher than an impurity concentration of the epitaxial layer in the third island, the third semiconductor region extending to the second buried layer after the step of forming the epitaxial layer and before the step of forming the isolation layer.

9. The method of manufacturing a semiconductor device according to claim 8, further comprising the steps of:

forming a third buried layer of the first conductivity type in the major surface of the semiconductor substrate;

forming a fourth buried layer of the first conductivity type in the major surface of said semiconductor substrate after the step of forming the second buried layer and before the step of forming the epitaxial layer.

10. The method of manufacturing a semiconductor device according to claim 9, wherein the isolation layer is formed on the third buried layer and the second semiconductor region is formed so as to include the fourth buried layer.

11. The method of manufacturing a semiconductor device according to claim 10, wherein the third buried layer and the fourth buried layer are formed simultaneously.

12. The method of manufacturing a semiconductor device according to claim 11, wherein the third buried layer and the fourth buried layer are respectively formed by injecting impurities of the first conductivity type on the major surface of the semiconductor substrate and by thermal diffusion.

* * * * *